United States Patent
Rajagopalan et al.

(10) Patent No.: US 7,354,790 B2
(45) Date of Patent: Apr. 8, 2008

(54) METHOD AND APPARATUS FOR AVOIDING DICING CHIP-OUTS IN INTEGRATED CIRCUIT DIE

(75) Inventors: Parthasarathy Rajagopalan, Milpitas, CA (US); Zafer Kutlu, Menlo Park, CA (US); Emery O. Sugasawara, Pleasanton, CA (US); Charles E. Vonderach, Livermore, CA (US); Dilip P. Vijay, Redwood City, CA (US); Yogendra Ranade, Fremont, CA (US); Jeff Hall, San Jose, CA (US); Dwight Manning, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 289 days.

(21) Appl. No.: 11/132,751

(22) Filed: May 18, 2005

(65) Prior Publication Data

US 2006/0160269 A1  Jul. 20, 2006

Related U.S. Application Data

(60) Provisional application No. 60/645,572, filed on Jan. 19, 2005.

(51) Int. Cl.
*H01L 21/66* (2006.01)

(52) U.S. Cl. .......................................................... 438/68
(58) Field of Classification Search .................. 438/6, 438/210, 104, 107–114, 118, 121–123, 128–129, 438/135, 142, 145, 149, 151, 157, 176, 478, 438/184, 193, 195–198, 200, 218, 237, 165, 438/294, 308, 337, 353, 378, 401
See application file for complete search history.

(56) References Cited

U.S. PATENT DOCUMENTS

| | | | |
|---|---|---|---|
| 7,087,452 B2* | 8/2006 | Joshi et al. | 438/68 |
| 2002/0098623 A1* | 7/2002 | Akram | 438/123 |
| 2003/0082836 A1* | 5/2003 | Fetterman et al. | 438/14 |
| 2003/0162368 A1* | 8/2003 | Connell et al. | 438/465 |
| 2006/0079024 A1* | 4/2006 | Akram | 438/110 |

* cited by examiner

*Primary Examiner*—Michael Lebentritt
*Assistant Examiner*—Andre Stevenson
(74) *Attorney, Agent, or Firm*—Eric James Whitesell

(57) ABSTRACT

A method and apparatus for avoiding dicing chip-outs in integrated circuit die comprises: (a) providing a wafer for forming a plurality of integrated circuit die thereon; (b) forming the plurality of integrated circuit die on the wafer; and (c) forming a saw street between the integrated circuit die on the wafer to relieve cutting stress in the wafer when the integrated circuit die are separated by a dicing saw.

18 Claims, 7 Drawing Sheets

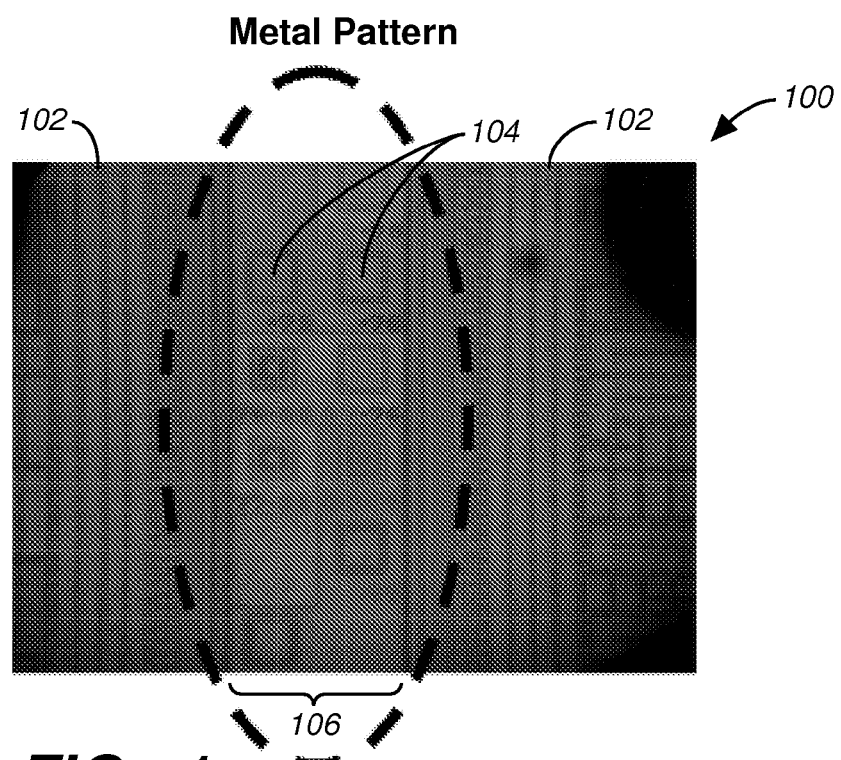
FIG._1
(PRIOR ART)
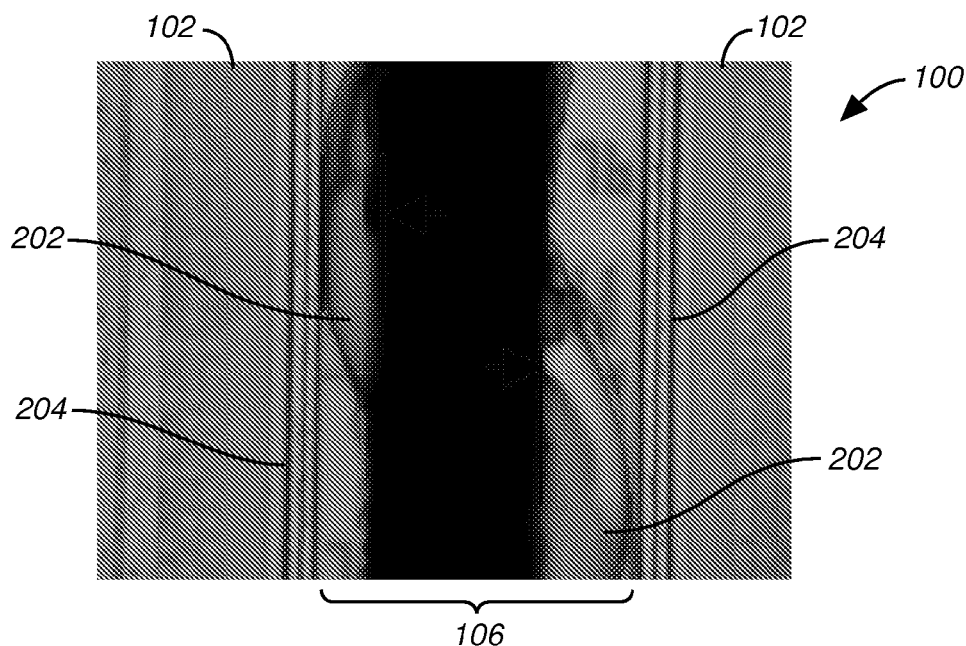
FIG._2
(PRIOR ART)

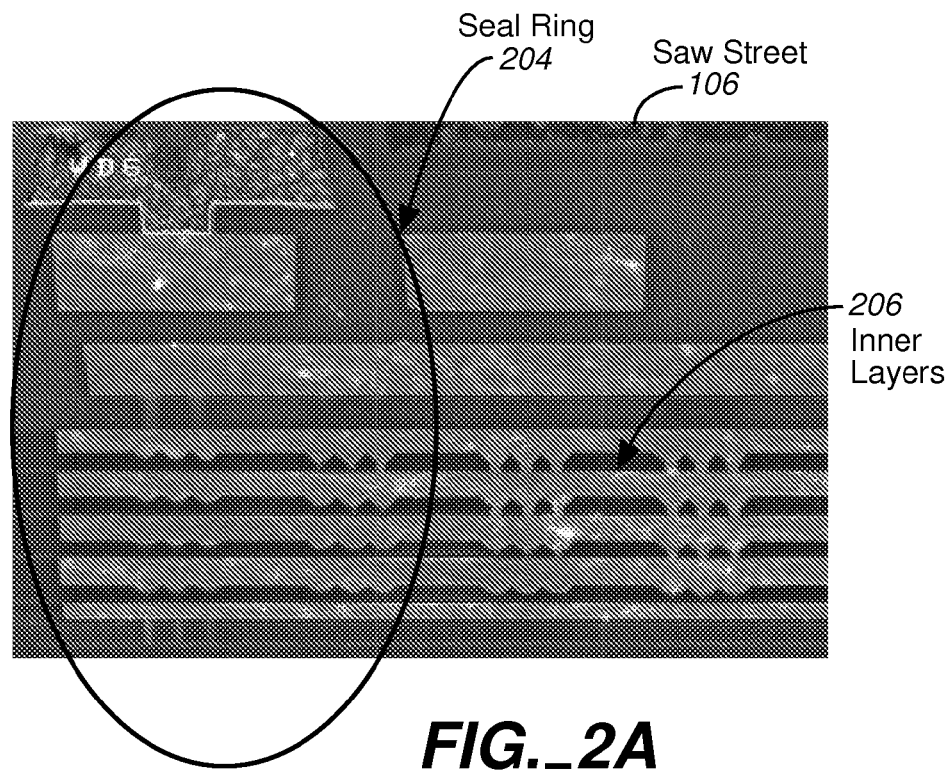
FIG._2A
*(PRIOR ART)*
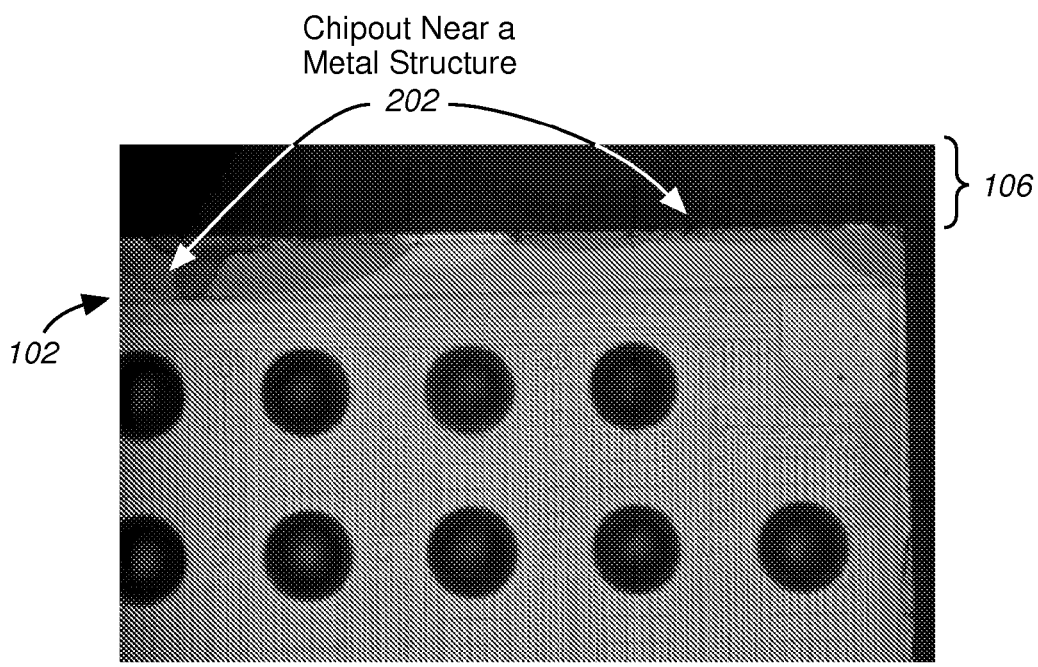
FIG._3
*(PRIOR ART)*

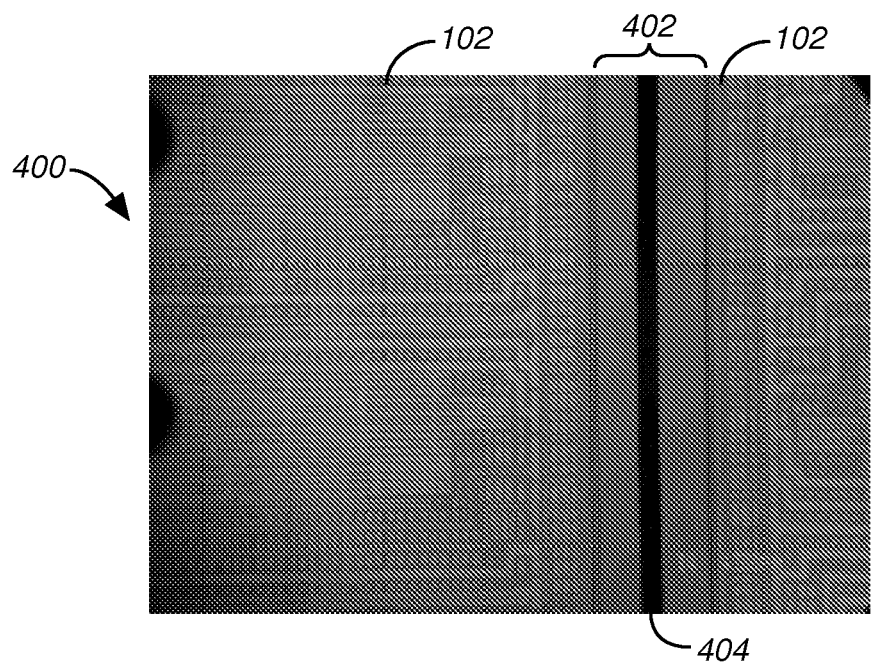
FIG._4
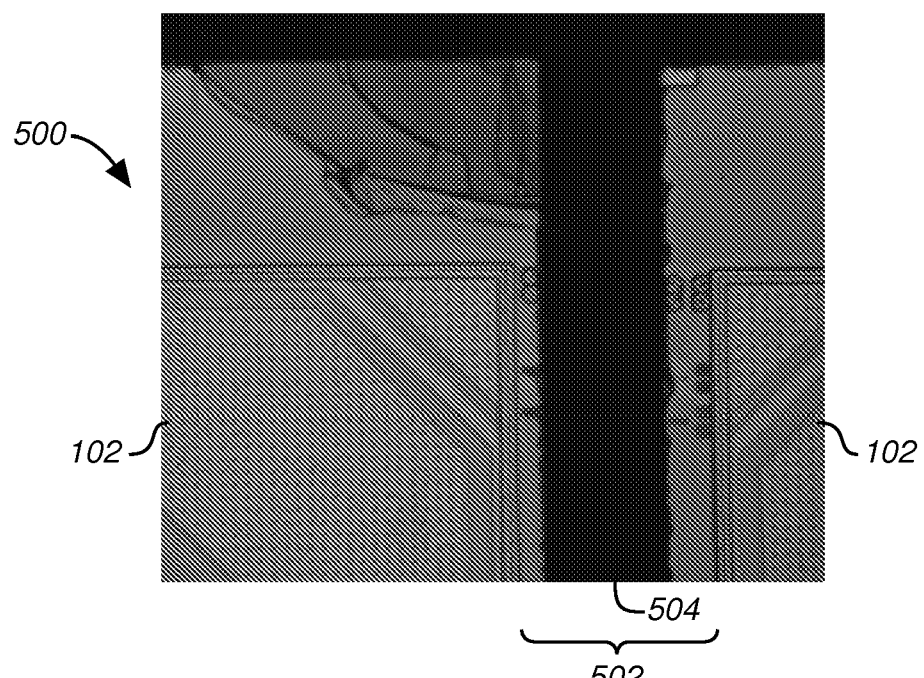
FIG._5

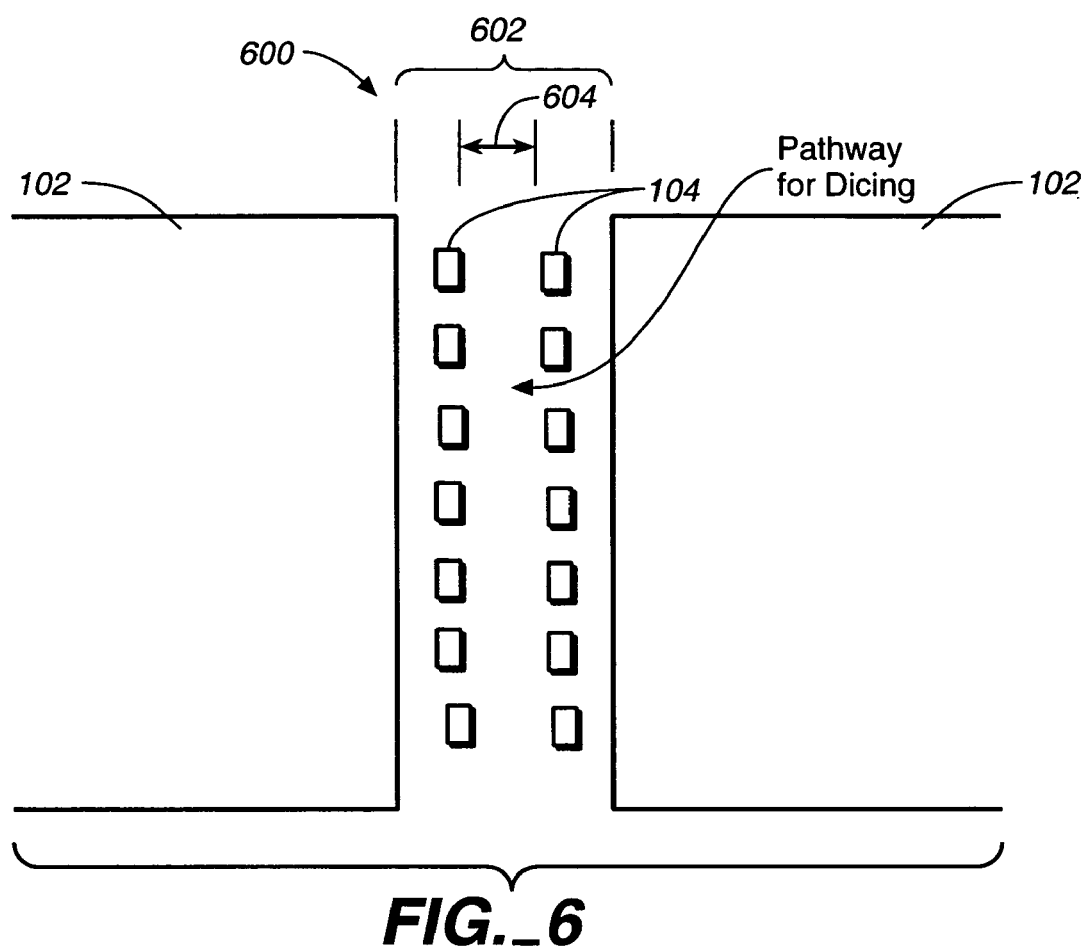
FIG._6

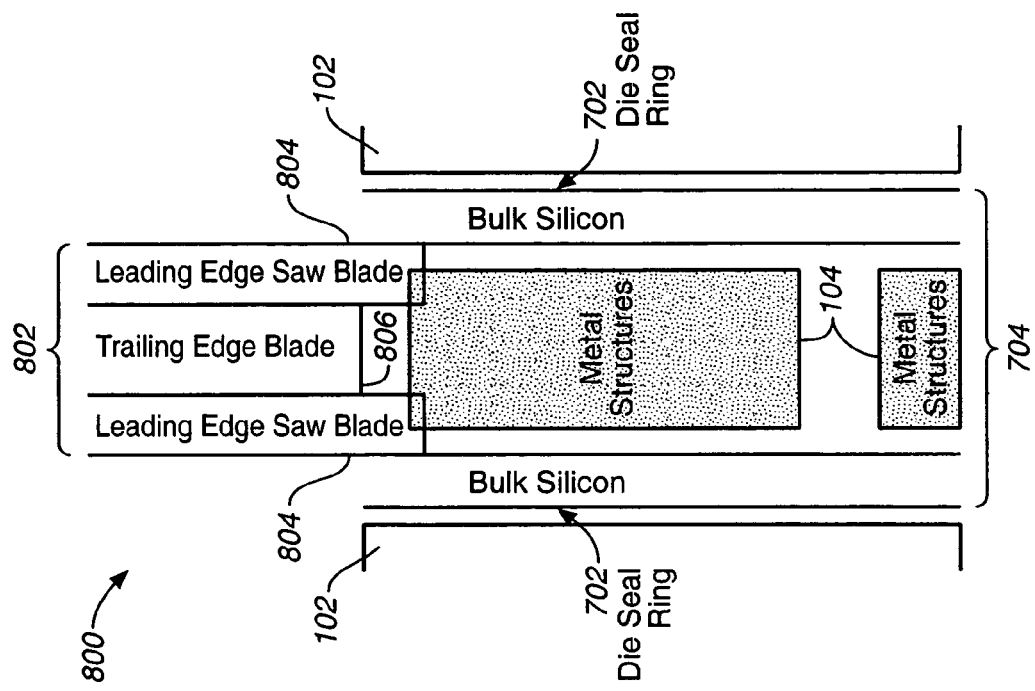
FIG._8
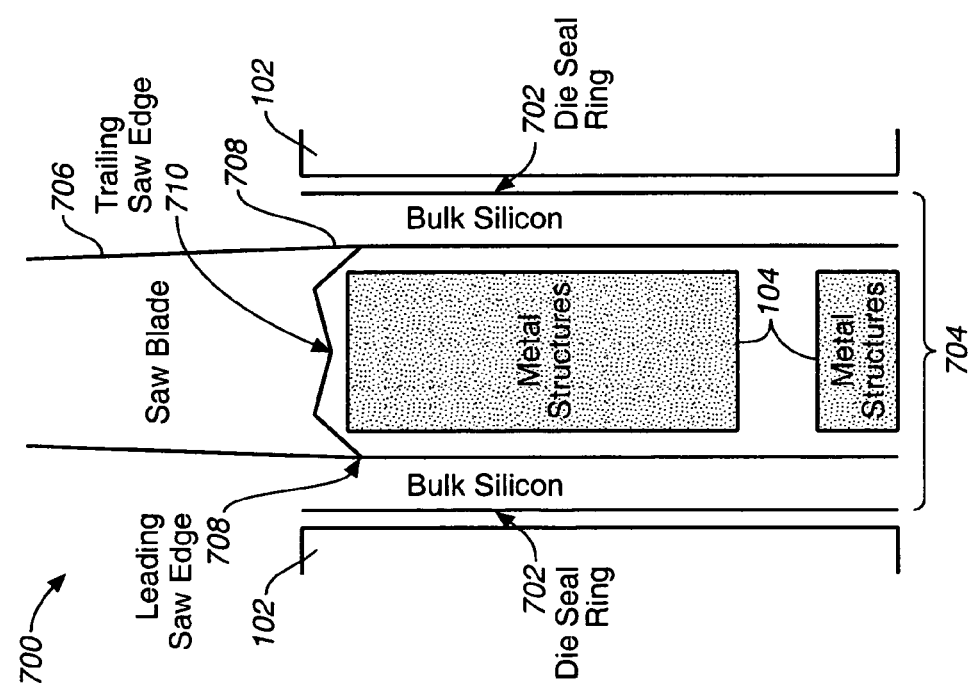
FIG._7

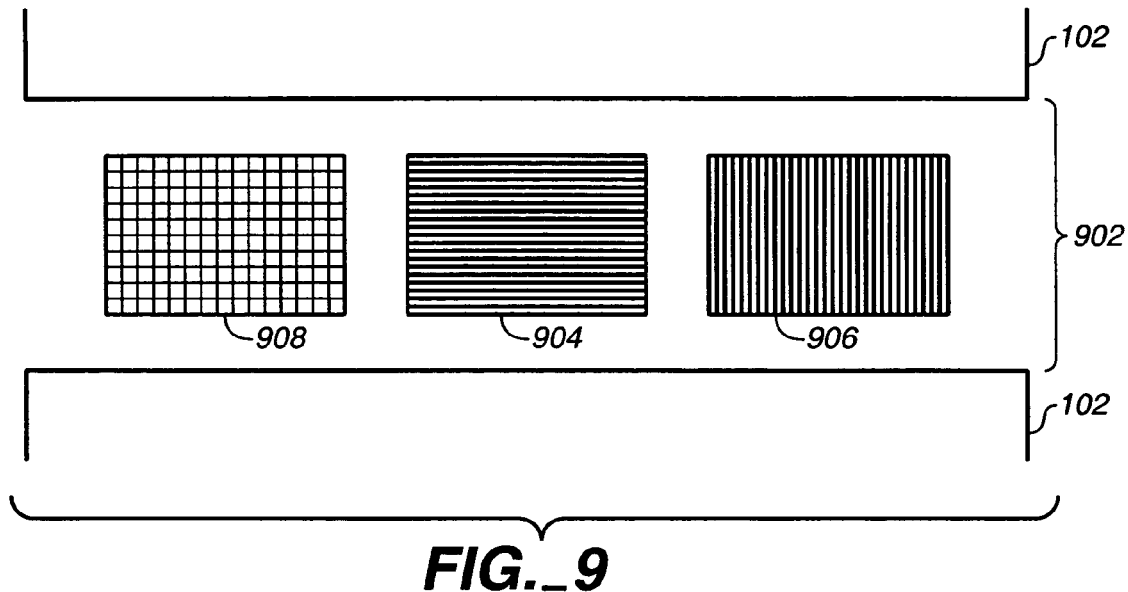
FIG._9
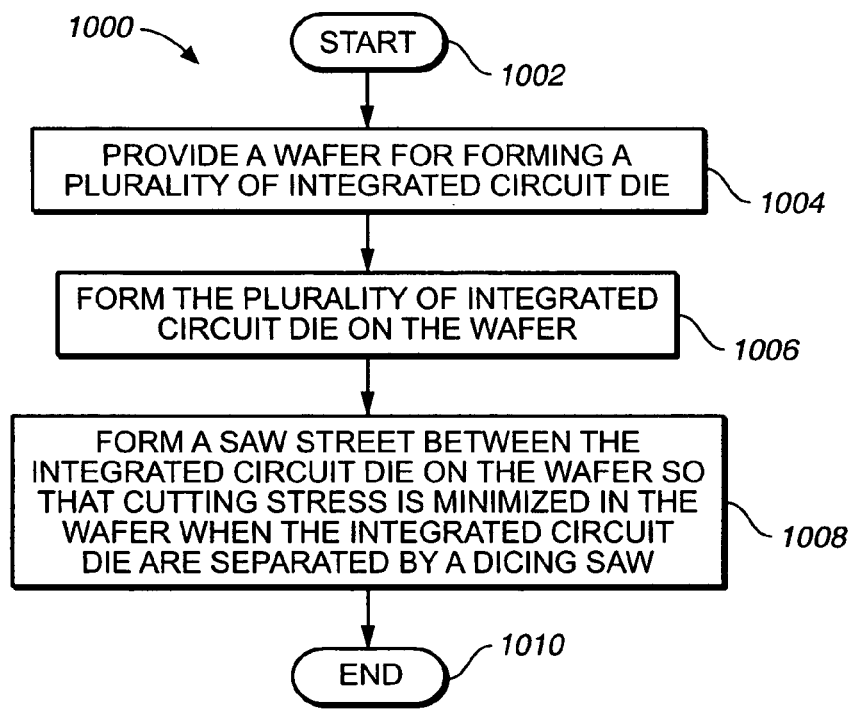
FIG._10

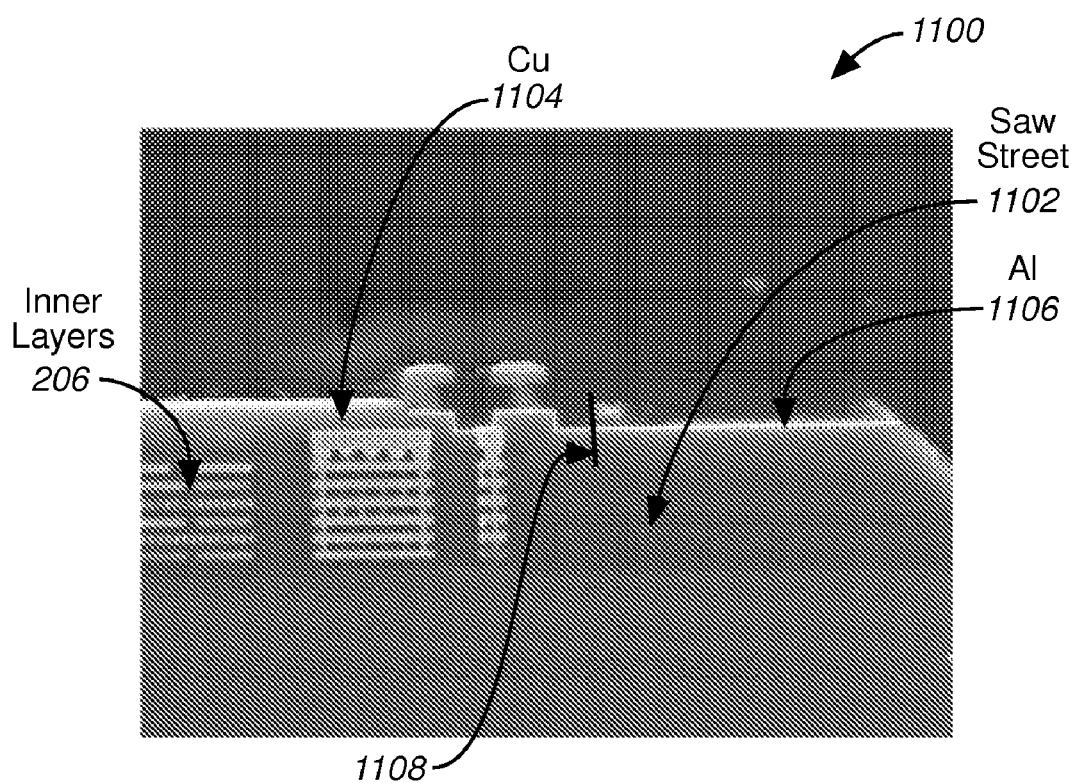
FIG._11

METHOD AND APPARATUS FOR AVOIDING DICING CHIP-OUTS IN INTEGRATED CIRCUIT DIE

CROSS REFERENCE TO RELATED APPLICATIONS

This application for patent claims the benefit of U.S. Provisional Patent Application Ser. No. 60/645,572, filed Jan. 19, 2005, incorporated herein by reference as if set forth in its entirety.

BACKGROUND OF THE INVENTION

1. Field of the Invention

The method of avoiding dicing chip-outs in integrated circuit die disclosed herein is directed to the design and manufacture of integrated circuit die. More specifically, but without limitation thereto, this method is directed to dicing silicon wafers to produce integrated circuit die.

2. Description of Related Art

A silicon wafer used in the manufacture of integrated circuit die typically includes temporary metal structures such as probe contact pads that are constructed in the unused space between the die and are used to perform a functional test of the die on the wafer before dicing. The space between a row or column of die on the wafer is called a saw street. After wafer testing, the wafer is sawed apart by a dicing saw that runs over the saw street. The dicing saw divides the wafer into individual die, removing the temporary metal structures.

SUMMARY OF THE INVENTION

A method of avoiding dicing chip-outs in integrated circuit die includes steps of:
(a) providing a wafer for forming a plurality of integrated circuit die thereon;
(b) forming the plurality of integrated circuit die on the wafer; and
(c) forming a saw street between the integrated circuit die on the wafer to relieve cutting stress in the wafer when the integrated circuit die are separated by a dicing saw.

In another embodiment, a wafer for manufacturing integrated circuit die includes:
a plurality of integrated circuit die formed on the wafer; and
a saw street formed between the integrated circuit die on the wafer to relieve cutting stress in the wafer when the integrated circuit die are separated by a dicing saw.

In a further embodiment, a dicing saw for relieving cutting stress includes:
at least two leading edges that leave from zero to no more than about 50 percent of a metal structure between a near side of a saw street and leading edges of a path cut through the saw street by the dicing saw; and
a trailing edge that harvests the metal structure remaining between the leading edges.

BRIEF DESCRIPTION OF THE DRAWINGS

The above and other aspects, features and advantages will become more apparent from the description in conjunction with the following drawings presented by way of example, wherein like references indicate similar elements throughout the several views of the drawings, and wherein:

FIG. 1 illustrates a top view of a portion of a wafer for manufacturing integrated circuit die according to the prior art;

FIG. 2 illustrates a top view of a portion of the wafer of FIG. 1 after dicing according to the prior art;

FIG. 2A illustrates a magnified side view of FIG. 2 according to the prior art;

FIG. 3 illustrates a magnified top view of FIG. 2 according to the prior art;

FIG. 4 illustrates a top view of a portion of a wafer having a wide saw street;

FIG. 5 illustrates a top view of a portion of a wafer after dicing in which no metal structures are placed in the saw street;

FIG. 6 illustrates a top view of a portion of a wafer with metal structures arranged in the saw street outside the path of the dicing saw;

FIG. 7 illustrates a top view of a portion of a wafer with metal structures arranged in the saw street and a single-blade dicing saw having leading edges and a trailing edge;

FIG. 8 illustrates a top view of a portion of a wafer with metal structures arranged in the saw street and a dicing saw having two leading edge blades and a trailing blade;

FIG. 9 illustrates a top view of a portion of a wafer with metal structures arranged in the saw street that are patterned to reduce their metal density;

FIG. 10 illustrates a flow chart of a method of avoiding dicing chip-outs in integrated circuit die; and FIG. 11 illustrates a cross-sectional view of a wafer in which copper is replaced with aluminum in the saw street area.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that are useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing the general principles incorporated into the illustrated embodiments. Also, the terms and expressions used herein have the ordinary meaning as is usually accorded to such terms and expressions by those skilled in the corresponding respective areas of inquiry and study except as otherwise defined herein.

FIG. 1 illustrates a top view of a portion of a wafer 100 for manufacturing integrated circuit die according to the prior art. Shown in FIG. 1 are integrated circuit die 102, temporary metal structures 104, and a saw street 106.

In FIG. 1, the temporary metal structures 104 are typically probe contact pads used during testing of the wafer 100 during sorting of the wafer into a performance category.

FIG. 2 illustrates a top view of a portion of the wafer 100 of FIG. 1 after dicing according to the prior art. Shown in FIG. 2 are integrated circuit die 102, a saw street 106, chip-outs 202, and die seal rings 204.

In FIG. 2, the saw street 106 has been cut by a dicing saw (not shown) to separate the integrated circuit die 102 from the wafer 100. When the dicing saw cuts through metal structures placed in the saw street, cutting stresses in the wafer cause the chip-outs 202 to be peeled away from the sides of the cut. The chip-outs 202 may extend into the integrated circuit die 102, resulting in performance failure and lower wafer yield. In low-k wafers that include die seal rings 204 to protect the weak inner layers of the wafer, the chip-outs 202 can break the die seal rings 204, compromising the reliability of the die. Even slight damage to the passivation on the surface of the wafer can result in cracking of low-k layers in the wafer over time.

FIG. 2A illustrates a magnified side view of FIG. 2 according to the prior art. Shown in FIG. 2A are a saw street 106, a die seal ring 204, and inner die layers 206.

In FIG. 2A, the die seal ring 204 provides protection to the inner die layers 206, however, the die seal ring 204 is susceptible to damage from cracking due to die stress caused by cutting through metal structures in the saw street 106.

FIG. 3 illustrates a magnified top view of FIG. 2 according to the prior art. Shown in FIG. 3 are integrated circuit die 102, a saw street 106, and chip-outs 202.

The chip-outs 202 are especially problematic in low-k materials that are used in low-k/Cu wafers due to a weak interface in the wafer between the oxide/low-k layer and the silicon/low-k layer. Occasionally, chip-outs occur that peel film from the active side of the wafer peel at either the oxide/low-k layer or the silicon/low-k layer, resulting in a greater number of die failures in low-k materials. Also, the copper metal layers used for wafers in newer chip technologies have a lower absorption energy and are more compliant than the previous aluminum metal layers. As a result, the dicing saw drags the copper along, causing significantly more chip-outs compared to aluminum. Due to the vulnerability of wafers to chip-out damage during the dicing process, it is desirable to find ways to avoid chip-outs.

FIG. 4 illustrates a top view of a portion of a wafer 400 having a wide saw street. Shown in FIG. 4 are integrated circuit die 102, a saw street 402, and a dicing cut 404.

In the arrangement of FIG. 4, no metal structures are placed in the saw street 402, and the saw street 402 has a width of at least about 80 microns. The greater width of the saw street 402 compared to a saw street having a width only slightly greater than the kerf width of the dicing saw creates a longer path for any microcracks to propagate from the dicing cut 404 that may occur in the wafer 400 during stress testing and provides a buffer zone to absorb dicing anomalies over the lifetime of the die product.

In one embodiment, a wafer for manufacturing integrated circuit die includes:
a plurality of integrated circuit die formed on the wafer; and
a saw street formed between the integrated circuit die on the wafer to relieve cutting stress in the wafer when the integrated circuit die are separated by a dicing saw.

FIG. 5 illustrates a top view of a portion of a wafer 500 after dicing in which no metal structures are placed in the saw street. Shown in FIG. 5 are integrated circuit die 102, a saw street 502, and a dicing cut 504.

In FIG. 5, no temporary metal structures are placed in the saw street 504. The saw street 504 preferably has a width of at least the kerf width of the dicing saw, for example, 50 microns. Because the saw street 504 is clear of metal structures, cutting stresses introduced in the wafer 400 during dicing are significantly relieved compared to the cutting stress in the wafer 100 of FIG. 1. The relieved cutting stress advantageously avoids chip-outs, especially in wafers incorporating low-k material.

FIG. 6 illustrates a top view of a portion of a wafer 600 with metal structures arranged in the saw street outside the path of the dicing saw. Shown in FIG. 6 are integrated circuit die 102, temporary metal structures 104, a saw street 602, and a pathway 604.

In FIG. 6, the temporary metal structures 104 are placed along the sides of the saw street 602 leaving the pathway 604 in the center of the saw street 602 wide enough for the dicing saw (not shown). The pathway 604 preferably has a width of at least the kerf width of the dicing saw, for example, 50 microns. Because the pathway 604 is clear of metal structures, cutting stresses introduced in the wafer 600 during dicing are greatly relieved compared to those of the wafer 100 in FIG. 1. The relieved cutting stresses avoid chip-outs, especially in wafers incorporating low-k material. The temporary metal structures 104 may be arranged in the saw street 602 in ways other than as shown to leave the pathway 604 free of metal structures.

In a further embodiment, a dicing saw includes:
at least two leading edges that leave from zero to no more than about 50 percent of a metal structure between a near side of a saw street and leading edges of a path cut through the saw street by the dicing saw; and
a trailing edge that harvests the metal structure remaining between the leading edges.

FIG. 7 illustrates a top view of a portion of a wafer 700 with metal structures arranged in the saw street and a single-blade dicing saw having leading edges and a trailing edge. Shown in FIG. 7 are integrated circuit die 102, temporary metal structures 104, die seal rings 702, a saw street 704, a dicing saw 706, leading edges 708, and a trailing edge 710.

In the arrangement of FIG. 7, the temporary metal structures 104 are placed in a single line down the center of the saw street 704. Preferably, from zero to no more than 50 percent of the temporary metal structures 104 is allowed between the near side of the saw street 704 and each leading edge 708 in the path cut by the dicing saw 706. In the example of FIG. 7, zero percent of the temporary metal structures 104 is allowed between the near side of the saw street 704 and each leading edge 708, so that the temporary metal structures 104 lie completely inside the leading edges 708 in the path cut by the dicing saw. As a result, the leading edges 708 of the dicing saw 706 cut first through only the wafer material at the bare sides of the saw street 704, providing a smooth cut barrier that reduces chip-out and damage to the die seal rings 702 from die edge cracking. The temporary metal structures 104 are then removed or "harvested" from inside the leading edges 708 by the trailing edge 710 of the dicing saw 706.

FIG. 8 illustrates a top view of a portion of a wafer 800 with metal structures arranged in the saw street and a dicing saw having two leading edge blades and a trailing edge blade. Shown in FIG. 8 are integrated circuit die 102, temporary metal structures 104, die seal rings 702, a saw street 704, a dicing saw 802, leading edge blades 804, and a trailing edge blade 806.

In the arrangement of FIG. 8, the leading edges and the trailing edge of the dicing saw are implemented as the two separate leading edge blades 804 and the trailing edge blade 806. Preferably, from zero to no more than 50 percent of the temporary metal structures 104 is allowed between the near side of the saw street 704 and each leading edge blade 804 in the path cut by the dicing saw 802. In the example of FIG. 8, about 25 percent of the temporary metal structures 104 is allowed between the near side of the saw street 704 and each leading edge blade 804. The leading edge blades 804 of the dicing saw 802 cut through less than 50 percent of the metal structures 104 in the saw street 704, resulting in a smoother cut barrier. The smoother cut barrier reduces chip-out and damage to the die seal rings 702 from die edge cracking compared to cutting through the entire width of the metal structures 104 at the same time. The temporary metal structures 104 are then removed or "harvested" between the leading edge blades 804 by the trailing edge blade 806 of the dicing saw 802.

FIG. 9 illustrates a top view of a portion of a wafer 900 with metal structures arranged in the saw street that are patterned to reduce their metal density. Shown in FIG. 9 are integrated circuit die 102, a saw street 902, and patterned metal structures 904, 906, and 908.

In the arrangement of FIG. 9, the solid metal structures used as probe contact pads during wafer testing are patterned to form the metal structures 904, 906, and 908 in the saw street 902. The patterning reduces the metal density of the pads while preserving their mechanical and electrical properties needed for wafer testing. The patterning may be, for example, longitudinal slotting as in the patterned metal structure 904, lateral slotting as in the patterned metal structure 906, or cross hatching as in the patterned metal structure 908. These and other patterns may be formed in the metal structures to reduce their metal density according to well known integrated circuit manufacturing techniques. The reduced metal density provided by the patterned metal structures 904, 906, and 908 further reduces the probability of chip-outs during dicing.

In a further embodiment, a method of avoiding dicing chip-outs in integrated circuit die includes steps of:
(a) providing a wafer for forming a plurality of integrated circuit die thereon;
(b) forming the plurality of integrated circuit die on the wafer; and
(c) forming a saw street between the integrated circuit die on the wafer to relieve cutting stress in the wafer when the integrated circuit die are separated by a dicing saw.

FIG. 10 illustrates a flow chart of a method of avoiding dicing chip-outs in integrated circuit die.

Step 1002 is the entry point of the flow chart 1000.

In step 1004, a wafer is provided for forming a plurality of integrated circuit die. The wafer may be, for example, a silicon wafer typically used in the manufacture of integrated circuits.

In step 1006, the plurality of integrated circuit die are formed on the wafer according to well known techniques.

In step 1008, a saw street is formed between the integrated circuit die on the wafer to relieve cutting stress in the wafer when the integrated circuit die are separated by a dicing saw.

Step 1010 is the exit point of the flow chart 1000.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

In another embodiment, chip-outs and crack propagation in the wafer may be avoided by replacing the copper metal layer in the saw street of the wafer with another electrically conductive metal, for example, aluminum. Because copper has a lower absorption energy compared to aluminum, more deformation in the copper occurs when it is cut by the dicing saw than would occur in aluminum. The greater degree of deformation in the copper results in greater cutting stress during dicing and the increased likelihood of forming cracks and chipouts that may propagate through the silicon into the die area.

FIG. 11 illustrates a cross-sectional view 1100 of a wafer in which copper is replaced with aluminum in the saw street area. Shown in FIG. 11 are inner layers 206, a saw street 1102, a copper metal layer 1104, an aluminum metal layer 1106, and a copper stop edge 1108.

In FIG. 11, the copper metal layer 1104 has been selectively removed in the saw street 1102 up to the copper stop edge 1108 during the fabrication of the wafer according to well-known wafer etching techniques. After the copper has been removed, the aluminum metal layer 1106 is deposited in the saw street 1102 according to well-known wafer deposition techniques. Metal structures (not shown) may then be formed in the saw street 1102 on the aluminum metal layer 1106 in the same manner previously used for a copper metal layer. The aluminum metal layer 1106 provides sufficient electrical conductivity needed by the metal structures in the saw street 1102 and relieves the cutting stress during dicing due to its relatively high absorption energy compared to copper.

The specific embodiments and applications thereof described above are for illustrative purposes only and do not preclude modifications and variations that may be made within the scope of the following claims.

What is claimed is:

1. A method comprising steps of:
   (a) providing a wafer for forming a plurality of integrated circuit die thereon;
   (b) forming the plurality of integrated circuit die on the wafer;
   (c) forming a saw street between the integrated circuit die on the wafer to relieve cutting stress in the wafer when the integrated circuit die are separated by a dicing saw; and
   (d) forming temporary metal structures in the saw street for testing the wafer, the metal structures formed at locations in the saw street selected to avoid cutting stress from the dicing saw.

2. The method of claim 1, step (d) further comprising arranging the metal structures in the saw street so that the metal structures lie completely outside a path cut by the dicing saw.

3. The method of claim 1, step (d) further comprising arranging the metal structures in the saw street so that the metal structures lie completely inside leading edges of a path cut by the dicing saw to prevent dicing cracks from propagating outside the path.

4. The method of claim 1, step (d) further comprising arranging the metal structures in the saw street so that no more than about 50 percent of the metal structures is allowed between a near side of the saw street and each leading edge of a path cut by the dicing saw.

5. The method of claim 1, step (d) further comprising patterning the metal structures street to reduce their metal density.

6. The method of claim 5 further comprising patterning the metal structures by one of striping slotting, and cross-hatching.

7. The method of claim 1 further comprising forming the saw street having a width of at least about 80 microns.

8. The method of claim 1 further comprising a step of separating the integrated circuit die with a dicing saw having leading edges that leave from zero to no more than about 50 percent of each of the metal structure remaining in the saw street between the near side of the saw street and each of the leading edges in a path cut by the dicing saw and having a trailing edge that harvests metal structure remaining inside the leading edges.

9. A wafer for manufacturing integrated circuit die comprising:
a plurality of integrated circuit die formed on the wafer;
a saw street formed between the integrated circuit die on the wafer to relieve cutting stress in the wafer when the integrated circuit die are separated by a dicing saw; and
temporary metal structures formed in the saw street for testing the wafer, the metal structures formed at locations selected to avoid cutting stress from the dicing saw.

10. The wafer of claim 9 further comprising the metal structures placed in the saw street so that the metal structures lie completely outside a path cut by the dicing saw.

11. The wafer of claim 9 further comprising the metal structures arranged in the saw street so the metal structures lie completely between leading edges of a path cut by the dicing saw to prevent dicing cracks from propagating outside the path.

12. The wafer of claim 9 further comprising the metal structures arranged in the saw street so that no more than about 50 percent of the metal structures remains between a near side of the saw street and leading edges of a path cut by the dicing saw.

13. The wafer of claim 9 further comprising the metal structures having a pattern to reduce their metal density.

14. The wafer of claim 13, the pattern comprising one of striping, slotting, and cross-hatching.

15. The method of claim 1, step (c) further comprising replacing a portion of a copper metal layer of the wafer with another electrically conductive metal in the saw street that has a higher absorption energy than copper.

16. The method of claim 15 step (c) further comprising replacing a portion of a copper metal layer of the wafer with aluminum.

17. The wafer of claim 9 further comprising a portion of a copper metal layer of the wafer being replaced with another electrically conductive metal in the saw street that has a higher absorption energy than copper.

18. The wafer of claim 17 further comprising a portion of a copper metal layer of the wafer being replaced with aluminum.

* * * * *